United States Patent [19]
Lee

[11] Patent Number: 5,930,610
[45] Date of Patent: Jul. 27, 1999

[54] METHOD FOR MANUFACTURING T-GATE

[75] Inventor: Won Sang Lee, Seoul, Rep. of Korea

[73] Assignee: LG Semicon Co., Ltd., Chungcheongbuk-Do, Rep. of Korea

[21] Appl. No.: 08/767,971

[22] Filed: Dec. 17, 1996

[30] Foreign Application Priority Data

Dec. 18, 1995 [KR]  Rep. of Korea ........................ 95-51423

[51] Int. Cl.⁶ .......................... H01L 21/338; H01L 21/28; H01L 21/44
[52] U.S. Cl. ........................... 438/182; 438/572; 438/574; 438/579
[58] Field of Search ................................... 438/182, 574, 438/579, 572

[56] References Cited

U.S. PATENT DOCUMENTS 4,337,115  6/1982  Ikeda et al. .
5,288,660  2/1994  Hua et al. .
5,856,232  1/1999  Yang et al. .

*Primary Examiner*—John F. Niebling
*Assistant Examiner*—Josetta Jones
*Attorney, Agent, or Firm*—John P. White; Cooper & Dunham LLP

[57] ABSTRACT

Method for manufacturing a T-gate useful for reducing a gate resistance, improving through-put, and simplifying an MMIC (monolithic microwave integrated circuit) process is disclosed, the method including the steps of depositing a first photoresist layer on a semiconductor substrate and patterning the first photoresist layer so as to expose a predetermined portion of the surface of the substrate; successively forming a seed metal layer and a second photoresist layer on the entire surface inclusive of the exposed substrate and patterning the second photoresist layer so as to define a gate electrode region; plating Au on the seed metal layer on the gate electrode region so as to form a gate electrode; and removing the first and second photoresist layers and the seed metal layer except the gate electrode.

16 Claims, 6 Drawing Sheets

METHOD FOR MANUFACTURING T-GATE

BACKGROUND OF THE INTENTION

1. Field of the Invention

The present invention relates to a method for manufacturing a semiconductor device and, more particularly, to a method for manufacturing a T-gate useful for reducing a gate resistance, improving through-put, and simplifying an MMIC (monolithic microwave integrate circuit) process.

2. Discussion of the Related Art

One of methods for improving frequency characteristics of a MESFET device has been proposed in which a gate length is shortened. However, if the gate length is shortened, a gate serial resistance is increased, thereby degrading the frequency characteristics of the device. Hence, a method for manufacturing a T-gate to overcome the above-stated disadvantage has been proposed in which a contact area of a gate and a semiconductor substrate is minimized and a cross-sectional area of the gate is increased.

conventional methods for manufacturing a T-gate will be explained with reference to the accompanying drawings.

FIGS. 1a to 1e are cross-sectional views showing process steps of a method for manufacturing a tri-layer T-gate by using ultraviolet ray exposure. FIGS. 2a to 2e are cross-sectional views showing process steps of a conventional method for manufacturing a bi-layer T-gate by using electron beam.

Referring to FIG. 1a, in the method for manufacturing a T-gate by using ultraviolet ray, a first PMMA layer 2, a PMIPK layer 3, and a second PMMA layer 2a, which are a kind of polymer, are successively deposited on a semiconductor substrate 1 by using a spin-plating method. At this time, each of them is formed to have a different thickness due to its sensitivity of ultraviolet ray. The thicknesses of the first PMMA 2, the PMIPK 3, and the second PMMA 2a are respectively 0.1 $\mu$m, 0.9 $\mu$m, and 0.3 $\mu$m.

When as much as 1.3 $^{MJ}$/cm$^2$ of ultraviolet (UV) is exposed as shown in FIG. 1b, the first PMMA 2, the PMIPK 3, and the second PMMA 2a are removed by different amounts of predetermined portions respectively, as shown in FIG. 1c. That is to say, sensitivities of the three layers are different from one another according to the thicknesses so that, when UV exposure and development is performed by using a mask based on the second PMMA layer 2a, the first PMMA layer 2 among the three layers receives the smallest amount of UV exposure energy and even reflects the UV. Thus, the PMIPK layer 3 is removed most by the reflected UV from the first PMMA layer 2, whereas the first PMMA layer 2 is removed most slightly due to its lowest sensitivity of UV.

Referring to FIG. 1d, if a 6000 Angstrom thick metal layer is deposited on the entire surface inclusive of the surface of the substrate 1 exposed by UV exposure, a gate electrode 4a is patterned. Then, all layers except the gate electrode 4a are removed with a lift-off method, thereby completing the conventional T-gate by using UV.

A method for manufacturing a bi-layer T-gate by using electron beam will be explained with reference to the accompanying drawings.

Referring to FIG. 2a, a PMMA 12 and a PMAA 12a are successively formed on a semiconductor substrate 11 to have different thicknesses. At this time, the thickness of the PMMA 12 and the PMAA 12a are 0.2 $\mu$m and 0.8 $\mu$m respectively.

Subsequently, electron beam is exposed by utilizing E-beam lithography equipments, as shown in FIG. 2b, thereby differently patterning the PMMA layer 12 and the PMAA layer 12a, as shown in FIG. 2c.

Referring to FIG. 2d, a metal layer 13 is formed on the entire surface inclusive of the exposed surface of the substrate 11, so as to form a gate electrode 13a. Thereafter, the PMMA layer 12 and the PMAA layer 12a and the metal layer 13 except the gate electrode 13a are all removed by utilizing a lift-off method so that the gate electrode 13a are left alone, thereby completing a conventional T-gate by using electron beam.

Referring to FIGS. 3a to 3c, there is illustrated a method for manufacturing a T-gate by using electron beam.

First, a PMMA layer 21 and a PMAA layer 22 are patterned by a small dose of exposed electron beam and by a significant dose of exposed electron beam respectively, as shown in FIG. 3a.

Referring to FIG. 3b, there is illustrated a pattern form of the PMMA layer 22 after twice of electron beam exposures.

Referring to FIG. 3c, there is illustrated a pattern form of the PMMA layer 22 after three times of electron beam exposures.

Conventional methods for manufacturing a T-gate have the following problems. A length of a gate electrode is determined by an expose energy of UV or electron beam. Further, it is difficult to make a precise pattern (critical dimension (CD)) of a first PMMA layer because there are two or three layers over the first PMMA layer. Furthermore, when electron beam is utilized, through-put becomes inferior. Finally, if any physical damage is imposed on the gate electrode while carrying out a lift-off, the gate electrode may be impaired

SUMMARY OF THE INVENTION

Therefore, the present invention is directed to a method for manufacturing a T-gate useful for reducing gate serial resistance, improving through-put, and simplifying an MMIC (monolithic microwave integrated circuit) process that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a T-gate includes the steps of depositing a first photoresist layer on a semiconductor substrate and patterning the first photoresist layer so as to expose a predetermined portion of the surface of the substrate; successively forming a seed metal layer and a second photoresist layer on the entire surface inclusive of the exposed substrate and patterning the second photoresist layer so as to define a gate electrode region; plating Au on the seed metal layer on the gate electrode region so as to form a gate electrode; and removing the first and second photoresist layers and the seed metal layer except the gate electrode.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Referring to FIGS. 4a to 4e, there are illustrated process steps of a method for manufacturing a T-gate according to a preferred embodiment of the invention.

Figure 1A:
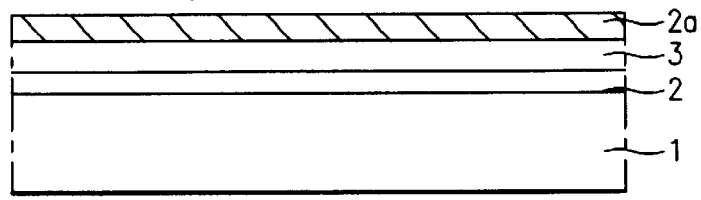
FIGS. 1a to 1e are cross-sectional views showing process steps of a conventional method for manufacturing a T-gate by using ultraviolet ray.
Figure 1B:
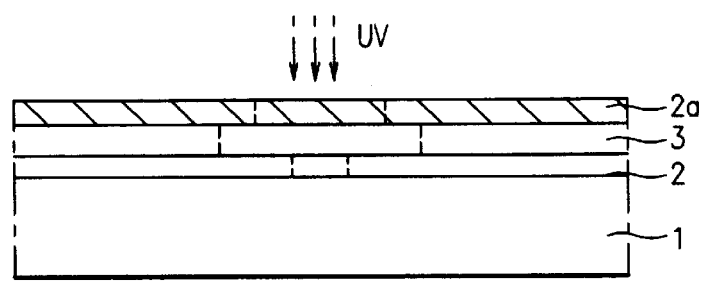
Figure 1C:
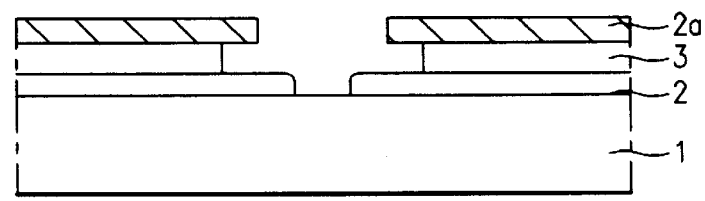
Figure 1D:
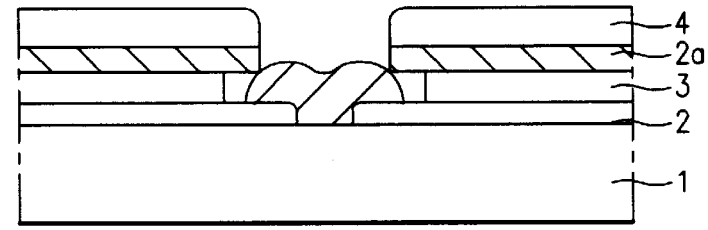
Figure 1E:
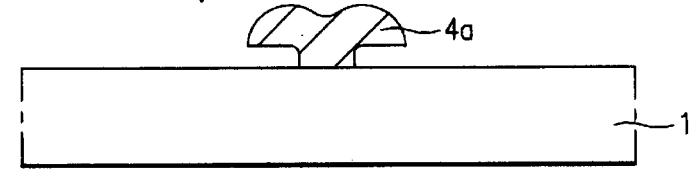
Figure 2A:
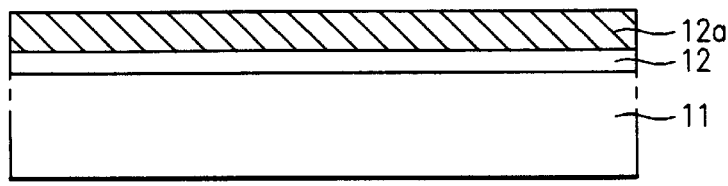
FIGS. 2a to 2e are cross-sectional views showing process steps of a conventional method for manufacturing a T-gate by using electron beam.
Figure 2B:
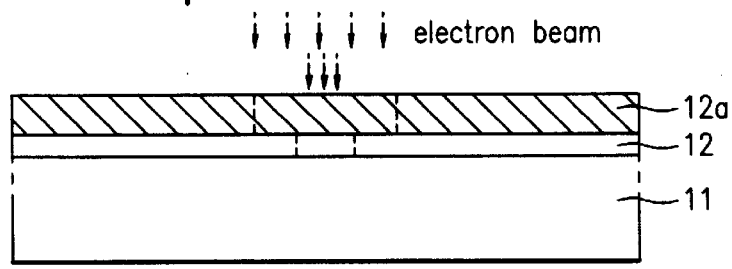
Figure 2C:
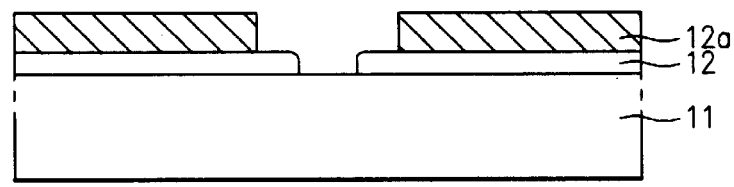
Figure 2D:
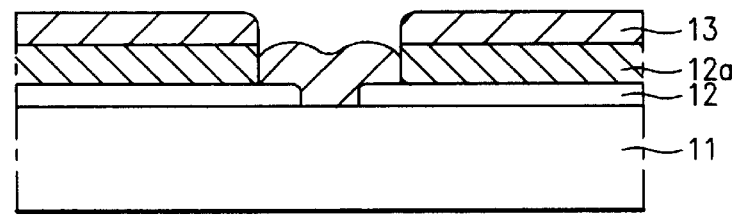
Figure 2E:
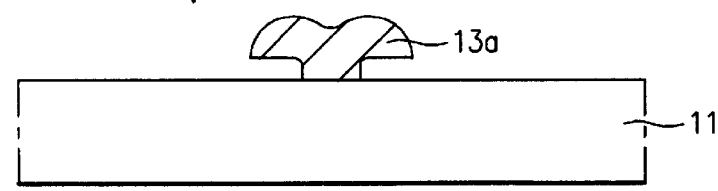
Figure 3A:
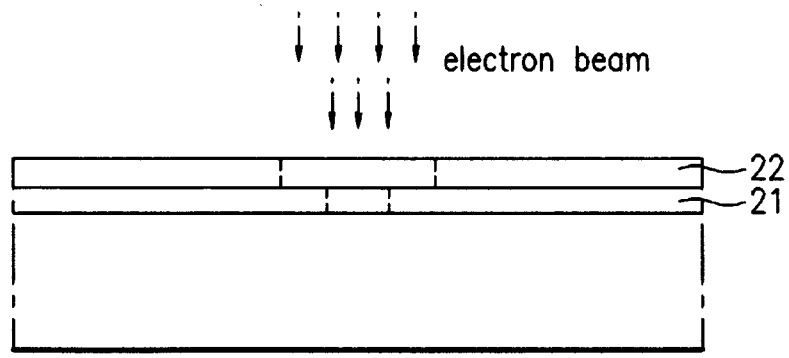
FIGS. 3a to 3c show conventional photoresist pattern forms according to exposures of electron beam.
Figure 3B:
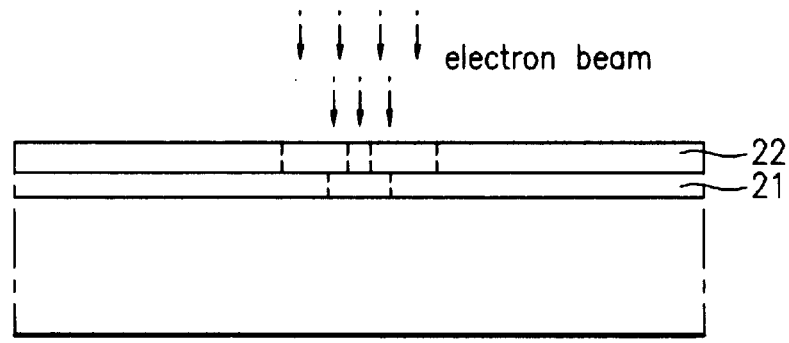
Figure 3C:
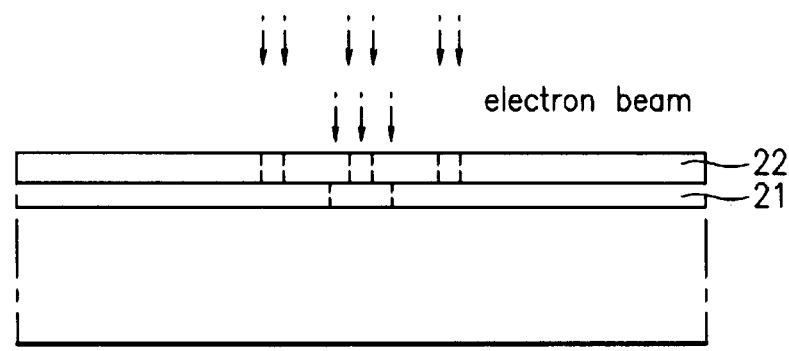
Figure 4A:
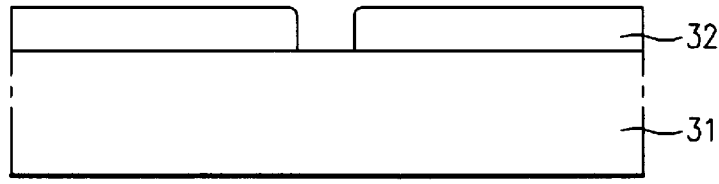
FIGS. 4a to 4e are cross-sectional views showing a method for manufacturing a T-gate according to a preferred embodiment of the invention.

First, as shown in FIG. 4a, a 2000 Angstrom thick PMMA layer 32 is formed on a semiconductor substrate 31 by using a spin-plating method and then is exposed to electron beam to be patterned to define a gate electrode region contacted with the substrate 31.

Figure 4B:
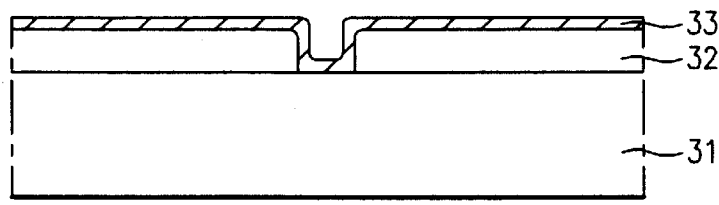

Secondly, a 1000 Angstrom thick seed metal layer 33 is formed for the following step of Au-plating, as shown in FIG. 4b.

Figure 4C:
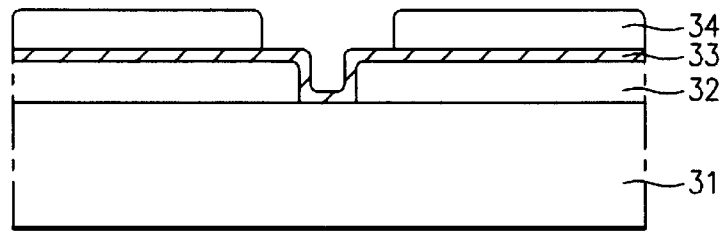

Next, a photoresist layer for G line or I line is deposited on the seed metal layer 33 and then is subjected to exposure and development to be patterned, as shown in FIG. 4c. At this time, since the seed metal layer 33 is a schottky electrode for a gate electrode, the deposition of the photoresist layer is carried out carefully. Due to the seed metal layer 33, intermixing between the PMMA layer 32 and the photoresist layer 34 for G line or I line is solved out. Moreover, since a wing size of the gate electrode is determined by the pattern of the photoresist layer 34 for G line or I line, it is easy to adjust the wing size of the gate electrode.

Figure 4D:
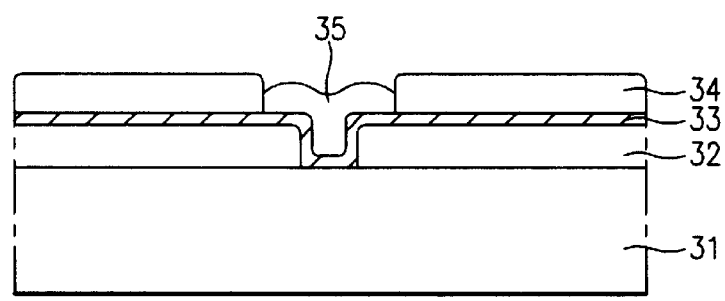

Subsequently, depending on a time of Au-plating, a thickness of the gate electrode 35 is adjusted, thereby forming a T-gate, as shown in FIG. 4d.

Figure 4E:
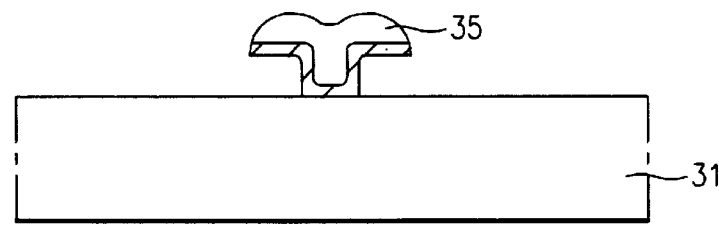

Thereafter, as shown in FIG. 4e, the photoresist layer 34 for G line or I line, the seed metal layer 33, and the PMMA layer 32 are successively removed by an etch process, thereby completing the manufacturing process of the T-gate. As this time, since it is an etch process, but not lift-off, that the photoresist layer 34, the seed metal layer 33, and the PMMA layer 32 are removed by, any physical damage does not happen to the gate electrode 35.

Figure 5A:
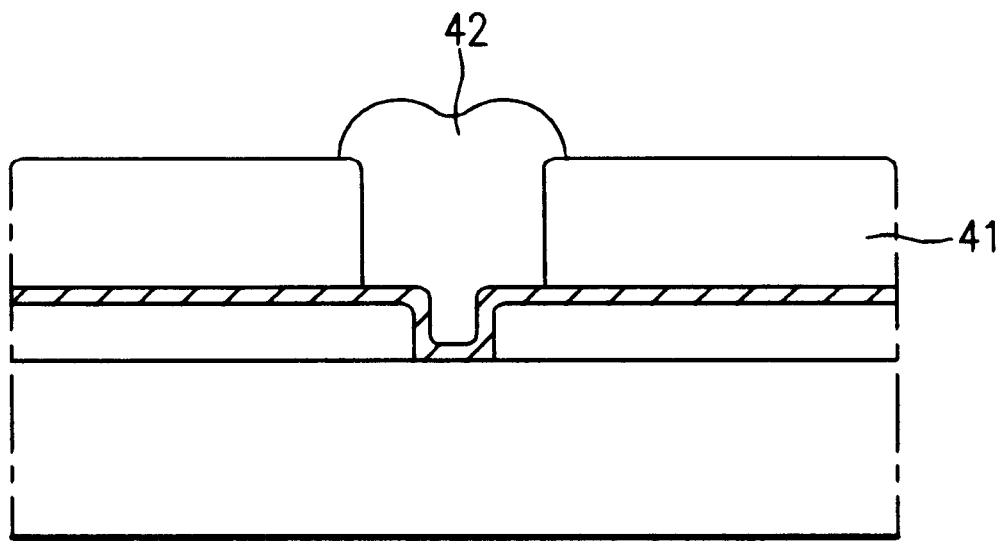
FIGS. 5a and 5b show a method for increasing a T-gate thickness according to the invention.
Figure 5B:
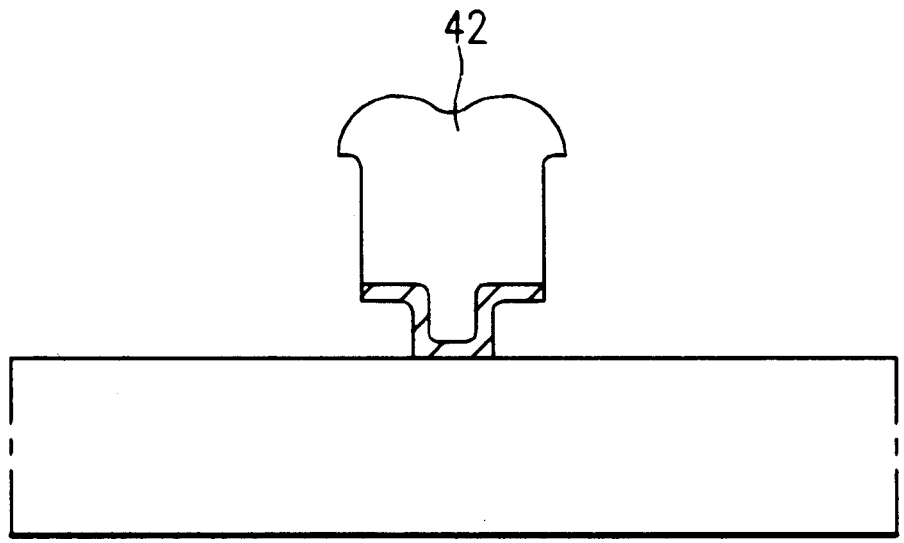

In another respect of the invention, FIGS. 5a and 5b show a method for increasing a T-gate thickness by adjusting a thickness of a gate electrode for G line or I line. That is to say, as a thickness of the photoresist layer for G line or I line is increased, the thickness of the gate electrode 42 is made increased. In another way, as a time of Au-plating is increased, the thickness of the gate electrode 42 is increased because of inherent characteristics of Au-plating.

FIGS. 6a to 6d are cross-sectional views showing process steps of a method for simultaneously carrying out Au-plating and forming a gate electrode according to the invention.

Figure 6A:
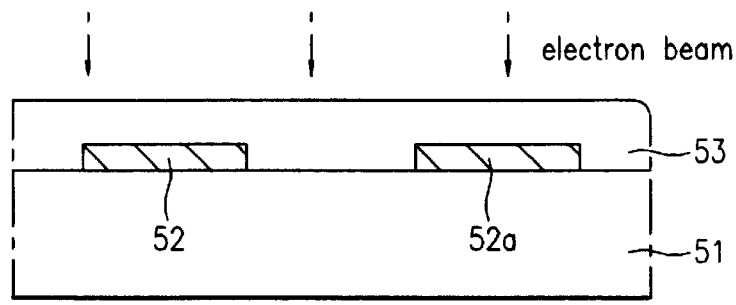
FIGS. 6a to 6d are cross-sectional views showing process steps of a method for simultaneously carrying out Au-plating and forming a gate electrode according to the invention.

First, as shown in FIG. 6a, a source ohmic pad 52 a drain ohmic pad 52a are formed on a semiconductor substrate 51. Then a PMMA layer 53 is formed on the substrate 51 inclusive of the source and drain ohmic pads 52 and 52a.

Figure 6B:
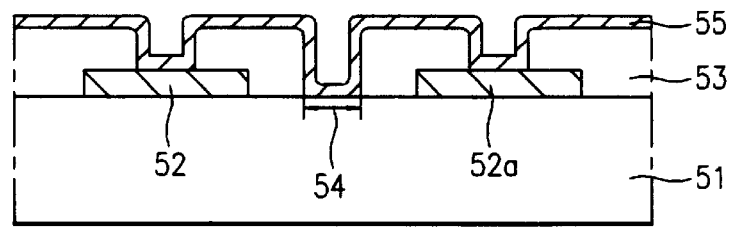

Secondly, a predetermined portion of each of the source and drain ohmic pads 52 and 52a is exposed, as shown in FIG. 6b. Simultaneously, a gate electrode region 54 is also patterned which will be contacted with the substrate 51. Then, as the seed metal layer, a Ti/Au layer 55 is formed on the entire surface inclusive of the exposed portions of the source ohmic pad 52 and the drain ohmic pad 52a and the gate electrode region 54.

Figure 6C:
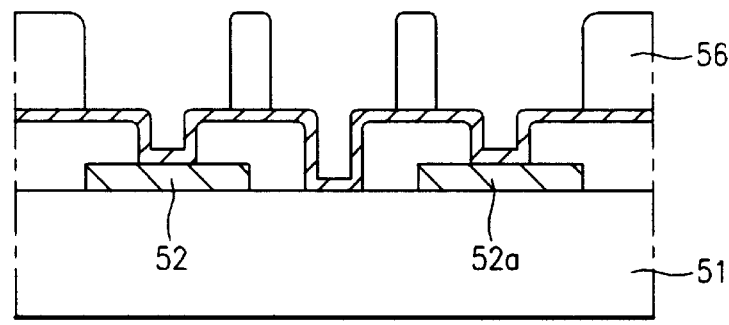

Referring to FIG. 6c, a photoresist layer 56 for G line or I line is deposited on the Ti/Au layer 55. Next, when opening the gate electrode region, only the photoresist layer 56 for G line or I line or the source and drain ohmic pads 52 and the 52a is removed to expose the Ti/Au layer 55.

Figure 6D:
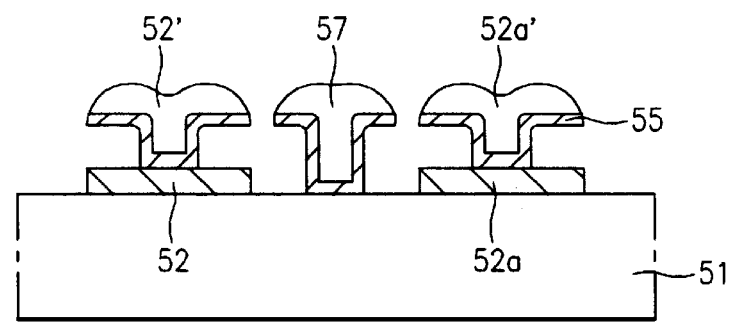

Referring to FIG. 6d, Au is plated on the exposed Ti/Au layer 55, thereby forming a gate electrode 57, a source electrode 52', and a drain electrode 52a'.

It is possible to significantly simplify the manufacturing process of a GaAs MMIC (gallium arsenide monolithic microwave Integrate circuit) by using the invention.

The method of the invention for manufacturing a T-gate has the following advantages.

First, it is easy to adjust a wing size of a gate electrode.

Second, a CD (critical dimension) of the gate electrode is safely maintained until the overall manufacturing process is completed. Moreover, a length of the CD can be minimized and equalized.

Third, it is easy to increase a thickness of the gate electrode, thereby decreasing a gate resistance.

Fourth, instead of a lift-off method, an etch process is preformed, so that any loss of the gate electrode can be prevented. Since the gate electrode is formed and, simultaneously Au-plating is carried out, the overall process is simplified.

It will be apparent to those skilled in the art that various modification and variations can be made in the method for manufacturing a T-gate of the present invention without departing from the spirit or scope of the inventions. Thus, it is intended that the present invention cover the modifications and variations of this invention provided they come within the scope of the appended claims and their equivalents.

What is claimed is:

1. A method for manufacturing a T-gate, comprising the steps of:

depositing a first photoresist layer on a semiconductor substrate and patterning the first photoresist layer so as to expose a predetermined portion of a surface of the semiconductor substrate;

successive formation of a seed metal layer and a second photoresist layer on the entire surface inclusive of the exposed substrate and patterning the second photoresist layer so as to define a gate electrode region;

plating gold on the seed metal layer over the gate electrode region so as to form a gate electrode; and, removing the second photoresist layer, the seed metal layer other than in the gate electrode region, and the first photoresist layer.

2. The method as claimed in claim 1, wherein said gate electrode is determined by patterns of the first and second photoresist layers.

3. The method as claimed in claim 1, wherein said first photoresist layer is a PMMA layer.

4. The method as claimed in claim 1, wherein said second photoresist layer, said seed metal layer, and said first photoresist layer are removed by an etch process.

5. The method as claimed in claim 1, wherein a thickness of the gate electrode depends on a time of gold-plating and a thickness of the first photoresist layer.

6. The method as claimed in claim 1, wherein said seed metal layer is a Ti/Au layer.

7. The method as claimed in claim 1, wherein said first photoresist layer is patterned by expose of electron beam.

8. The method as claimed in claim 1, wherein said second photoresist layer is a photoresist layer for G line or I line.

9. A method for manufacturing a T-type gate of a semiconductor device, the method comprising the steps of:

forming a source pad and a drain pad on a semiconductor substrate and depositing a first photoresist layer on the entire surface inclusive of the source and drain pads;

patterning the first photoresist layer to expose a predetermined portion of each of the source and drain pads and a predetermined portion of the surface of the substrate which will be contacted with a gate electrode;

forming a seed metal layer on the entire surface inclusive of the exposed portions of the source and drain pads and the exposed surface of the substrate and forming a second photoresist layer on the seed metal layer;

patterning the second photoresist layer to expose the second photoresist layer over regions where a source electrode, a drain electrode, and a gate electrode will be formed, respectively; and, plating gold on the exposed portions of the seed metal layer so as to form the gate electrode, the source electrode, and the drain electrode and removing the unnecessary second photoresist layer, the seed metal layer, and the first photoresist layer.

10. The method as claimed in claim 9, wherein said gate electrode is determined by a pattern of the second photoresist layer.

11. The method as claimed in claim 9, wherein said first photoresist layer is a PMMA layer.

12. The method as claimed in claim 9, wherein said second photoresist layer, the seed metal layer, and the first photoresist layer are removed by an etch process.

13. The method as claimed in claim 9, wherein a thickness of the gate electrode depends of a time of gold-plating and a thickness of the first photoresist layer.

14. The method as claimed in claim 9, wherein said seed metal layer is a Ti/Au layer.

15. The method as claimed in claim 9, wherein said first photoresist layer is patterned by expose of electron beam.

16. The method as claimed in claim 9, wherein said second photoresist layer is a photoresist layer for G line or I line.

* * * * *